(12) United States Patent
Andreaco et al.

(10) Patent No.: US 12,091,770 B1
(45) Date of Patent: Sep. 17, 2024

(54) ASYMMETRIC THERMAL FIELDS FOR EXCLUDING IMPURITIES IN SINGLE CRYSTAL MANUFACTURING DEVICE

(71) Applicant: Siemens Medical Solutions USA, Inc., Malvern, PA (US)

(72) Inventors: Mark Andreaco, Knoxville, TN (US); Peter Cohen, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 18/326,374

(22) Filed: May 31, 2023

(51) Int. Cl.
| | |
|---|---|
| *C30B 15/10* | (2006.01) |
| *C30B 15/14* | (2006.01) |
| *C30B 15/20* | (2006.01) |
| *C30B 29/16* | (2006.01) |

(52) U.S. Cl.
CPC ............ *C30B 15/206* (2013.01); *C30B 15/10* (2013.01); *C30B 15/14* (2013.01); *C30B 29/16* (2013.01)

(58) Field of Classification Search
CPC ....... C30B 15/206; C30B 15/10; C30B 15/14; C30B 29/16
See application file for complete search history.

(56) References Cited

U.S. PATENT DOCUMENTS

| | | | | |
|---|---|---|---|---|
| 5,690,731 | A | * 11/1997 | Kurata | .................... C30B 15/30 |
| | | | | 117/13 |
| 2013/0291788 | A1 | * 11/2013 | Houzvicka | .............. C30B 15/22 |
| | | | | 117/15 |
| 2020/0399783 | A1 | * 12/2020 | Sakamoto | ............. C30B 15/305 |

FOREIGN PATENT DOCUMENTS

| | | | |
|---|---|---|---|
| JP | 09286695 A | * | 11/1997 |
| JP | 2001002492 A | * | 1/2001 |
| WO | WO-2021020539 A1 | * | 2/2021 |

* cited by examiner

*Primary Examiner* — Hua Qi

(57) ABSTRACT

Disclosed herein is a furnace and a method of growing a high temperature oxide crystal. The furnace includes a cylindrical furnace wall, an induction coil disposed within the cylindrical furnace wall, a quartz tube disposed within the induction coil, a refractory lining disposed within the quartz tube, and a crucible disposed within the refractory lining, the crucible including a melt therein. A lid placed on the crucible. An asymmetric configuration of at least one of the crucible, the refractory lining, the quartz tube, the induction coil and the lid within the cylindrical furnace wall creates a thermal gradient that causes a cold spot in the melt to migrate from a first location to a second location of the melt. A rod having a seed crystal at an end thereof is lowered into the crucible to draw a boule from the melt via the seed crystal from the first location.

8 Claims, 11 Drawing Sheets

ASYMMETRIC THERMAL FIELDS FOR EXCLUDING IMPURITIES IN SINGLE CRYSTAL MANUFACTURING DEVICE

BACKGROUND OF THE INVENTION

Field of the Invention

The present invention relates generally to crystal growth for nuclear medical imaging, and in particular relates to methods for reducing impurities in high temperature oxide crystals grown for scintillation detectors used in Positron Emission Tomography (PET).

Description of the Related Art

In manufacturing a boule of Lutetium Oxyorthosilicate (LSO), Lutetium Yttrium Oxyorthosilicate (LYSO) or Gadolinium Aluminium Gallium Garnets (GAGG) type scintillators, powders are added to a crucible in an appropriate stoichiometric ratio heated to from a melt. A seed crystal is then lowered to contact the melt and then gradually drawn away from the melt to form the boule. It is desirable for any dopants in the melt to be evenly distributed as the boule is drawn so that the distribution of the dopants in the boule is uniform. It is also desirable for impurities to not be incorporated in the boule.

However, this is typically not the case. Due to the geometrical symmetry of the furnace and the thermal field it produces, a symmetrical flow field of the melt produces a cold spot in the center of the crucible, creating a location at which impurities can collect. Since the seed crystal contacts the melt in the center (i.e., at the cold spot), the impurities tend to become incorporated into the boule. It is therefore desirable to create a flow field in the crucible that moves impurities away from a location which a seed crystal contacts the melt.

BRIEF SUMMARY OF THE INVENTION

Disclosed herein is a method of growing a high temperature oxide crystal; wherein the method includes assembling a furnace including a cylindrical furnace wall, an induction coil disposed within the cylindrical furnace wall, a quartz tube disposed within the induction coil, a refractory lining disposed within the quartz tube, a crucible disposed within the refractory lining, the crucible including a melt therein, and a lid to cover the crucible, creating a thermal gradient in the melt by an asymmetric configuration of one the crucible, the refractory lining, the quartz tube, the induction coil, and the lid with respect to the cylindrical furnace wall to cause a cold spot in the melt to migrate from a first location to a second location of the melt, and drawing a boule from the first location away from the cold spot at the second location.

Disclosed herein also is a furnace for growing a high temperature oxide crystal; wherein the furnace includes a cylindrical furnace wall, an induction coil disposed within the cylindrical furnace wall, a quartz tube disposed within the induction coil, a refractory lining disposed within the quartz tube, a crucible disposed within the refractory lining, the crucible including a melt therein, a lid placed on the crucible, wherein an asymmetric configuration of at least one of the crucible, the refractory lining, the quartz tube, the induction coil and the lid within the cylindrical furnace wall creates a thermal gradient in the melt to cause a cold spot in the melt to migrate from a first location to a second location of the melt, and a rod having a seed crystal at an end thereof, wherein the rod is configured to draw a boule from the melt via the seed crystal from the first location.

BRIEF DESCRIPTION OF THE DRAWINGS

These and other features, aspects, and advantages of the present invention will become better understood with reference to the following description and appended claims, and accompanying drawings where:

Figure 1:
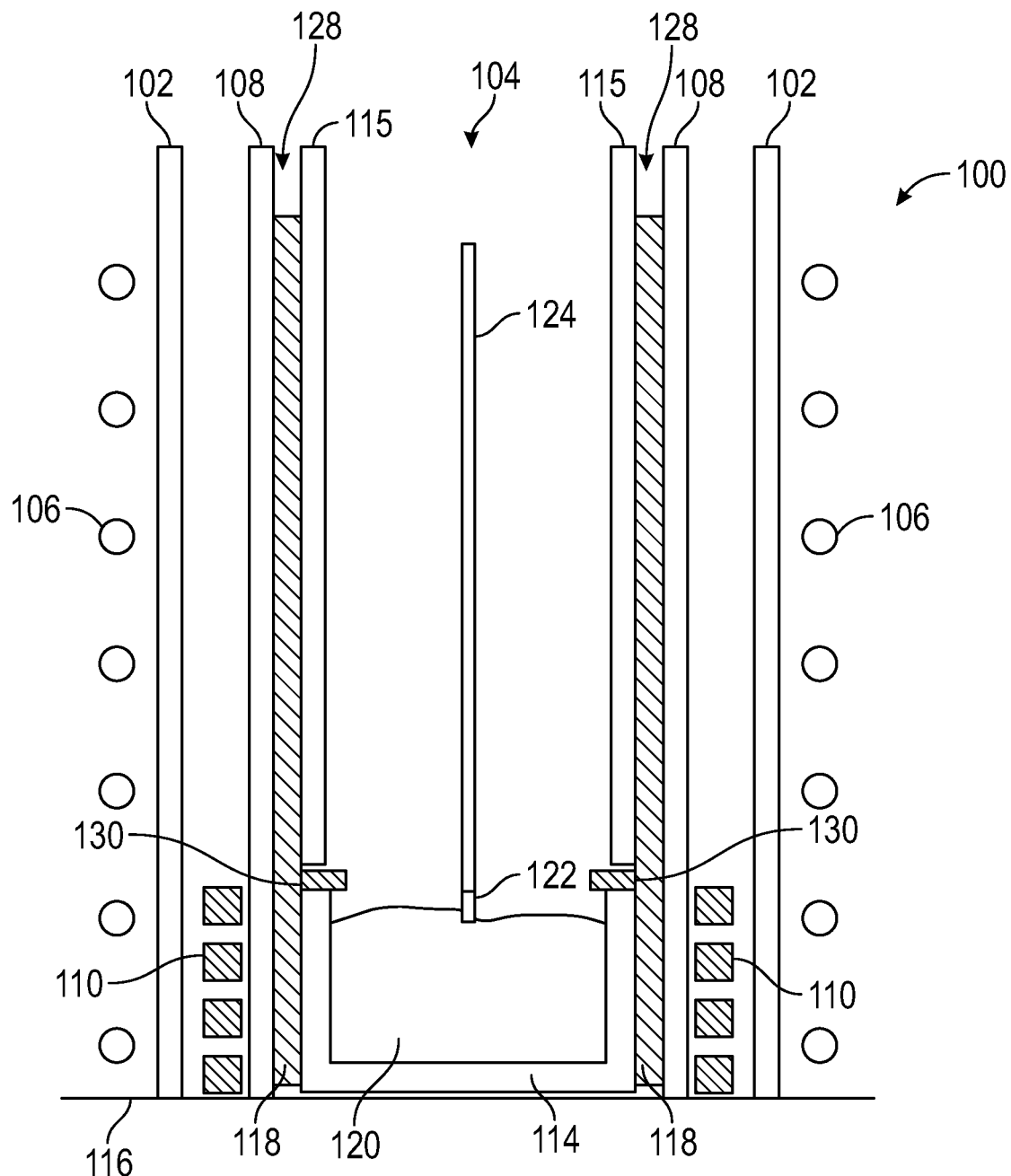
FIG. 1 is a side view of a furnace in which a boule is grown, in an illustrative embodiment.

It should be understood that the various embodiments are not limited to the arrangements and instrumentality shown in the drawings.

DETAILED DESCRIPTION OF THE INVENTION

The present invention may be understood more readily by reference to the following detailed description of preferred embodiments of the invention as well as to the examples included therein. All numeric values are herein assumed to be modified by the term "about," whether or not explicitly indicated. The term "about" generally refers to a range of numbers that one of skill in the art would consider equivalent to the recited value (i.e., having the same function or result). In many instances, the term "about" may include numbers that are rounded to the nearest significant figure.

FIG. 1 is a side view of a furnace 100 in which a boule is grown, in an illustrative embodiment. The furnace 100 includes a cylindrical furnace wall 102 enclosing a space 104. A copper coil 106 is wrapped around an outer surface of the cylindrical furnace wall 102. Water or coolant flows through the copper coil 106 to carry heat away from the furnace 100 or maintain a temperature in the space 104 within the furnace 100. A quartz tube 108 is disposed concentrically within the cylindrical furnace wall 102. An induction coil 110 disposed is in an annulus between the quartz tube 108 and the cylindrical furnace wall 102. A crucible 114 is placed at a bottom surface 116 of the furnace 100 within the quartz tube 108. The crucible 114 includes a right cylindrical wall extending upward from a bottom crucible surface. The crucible 114 can be made of iridium. The crucible 114 extends partway up the furnace 100 from the bottom surface 116. A brick cylinder or ceramic cylinder 115 extends from a top of the crucible 114 to a top or lid 130 of the furnace 100. A refractory lining 118 is disposed in an annulus 128 between the quartz tube 108 and the crucible 114/ceramic cylinder 115.

To make a boule, ingredients for forming a melt 120 are disposed in the crucible 114 and the crucible 114 is placed concentrically within the furnace 100. The induction coil 110 is activated to heat the ingredients to form the melt 120. A seed crystal 122 is lowered through the ceramic cylinder 115 at an end of a rod 124 to contact a top of the melt 120 at a seed location (i.e., a location at which the boule is to be drawn from the melt). The seed crystal 122 is then drawn upward from the melt 120, allowing the melt 120 to cool and crystallize around the seed crystal 122. Drawing the seed crystal 122 upward therefore creates a boule or cylindrical crystal.

Figure 2:
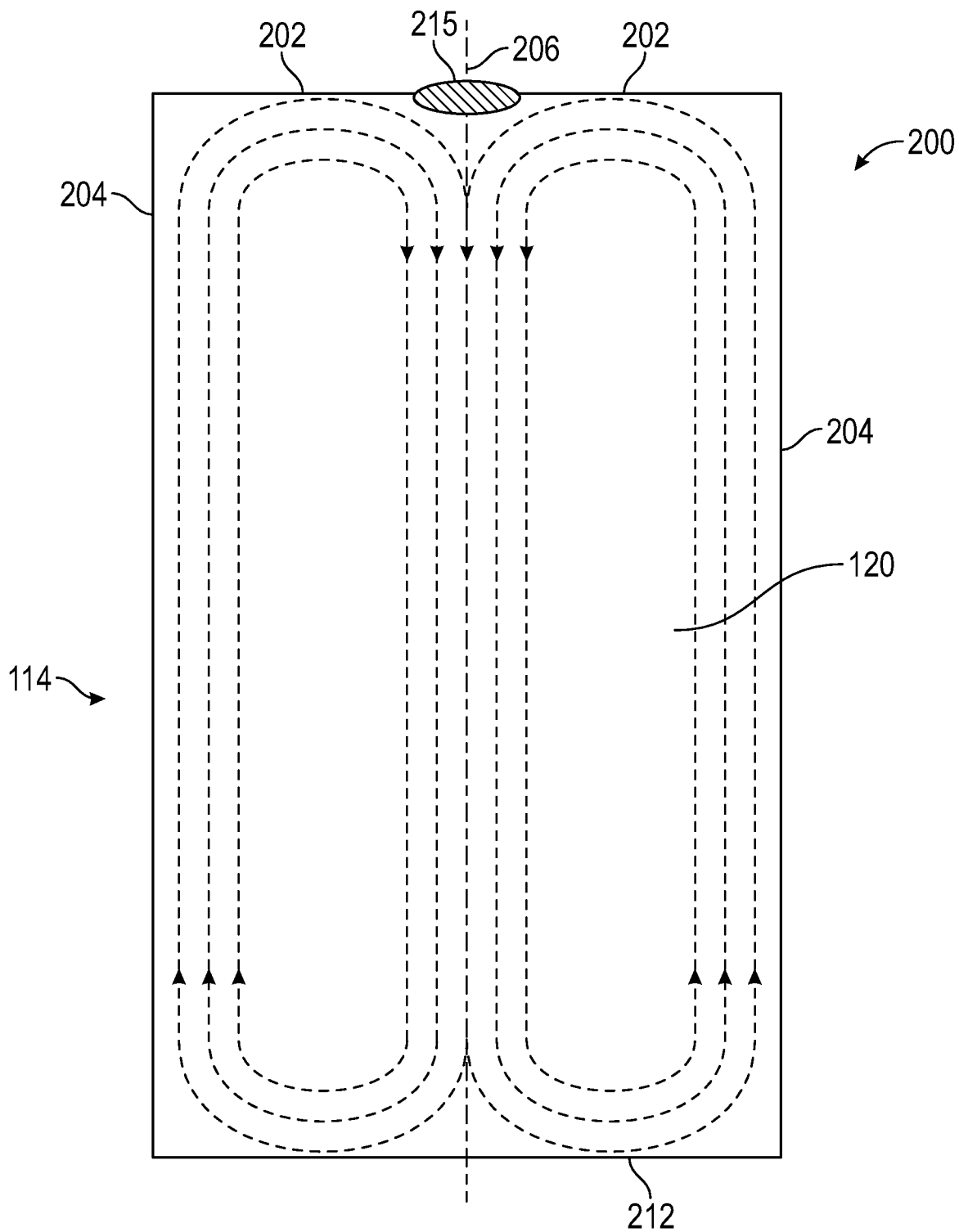
FIG. 2 shows a side view of a crucible during a heating of a melt in the crucible in a symmetric configuration.

FIG. 2 shows a side view 200 of the crucible during a heating of the melt in a symmetric configuration. Convection cells 202 form in the melt 120 when the melt heated above a given temperature. The heat at the wall 204 of the crucible 114 causes the melt 120 to flow upward at the wall 204. Upon reaching the top of the crucible 114, the melt 120 migrates radially inward toward a central axis 206 of the crucible 114, cooling in the process. A cold spot 215 thus develops at the top of the melt at the central axis 206. Impurities will tend to collect at the cold spot 215. The melt 120 then descends to the bottom of the crucible 114 along the central axis 206. The method disclosed herein creates a thermal gradient in the melt to move the cold spot 215 from a first location (e.g., the furnace central axis 310 (see FIG. 3)) to a second location (e.g., away from the central axis 206).

Figure 3:
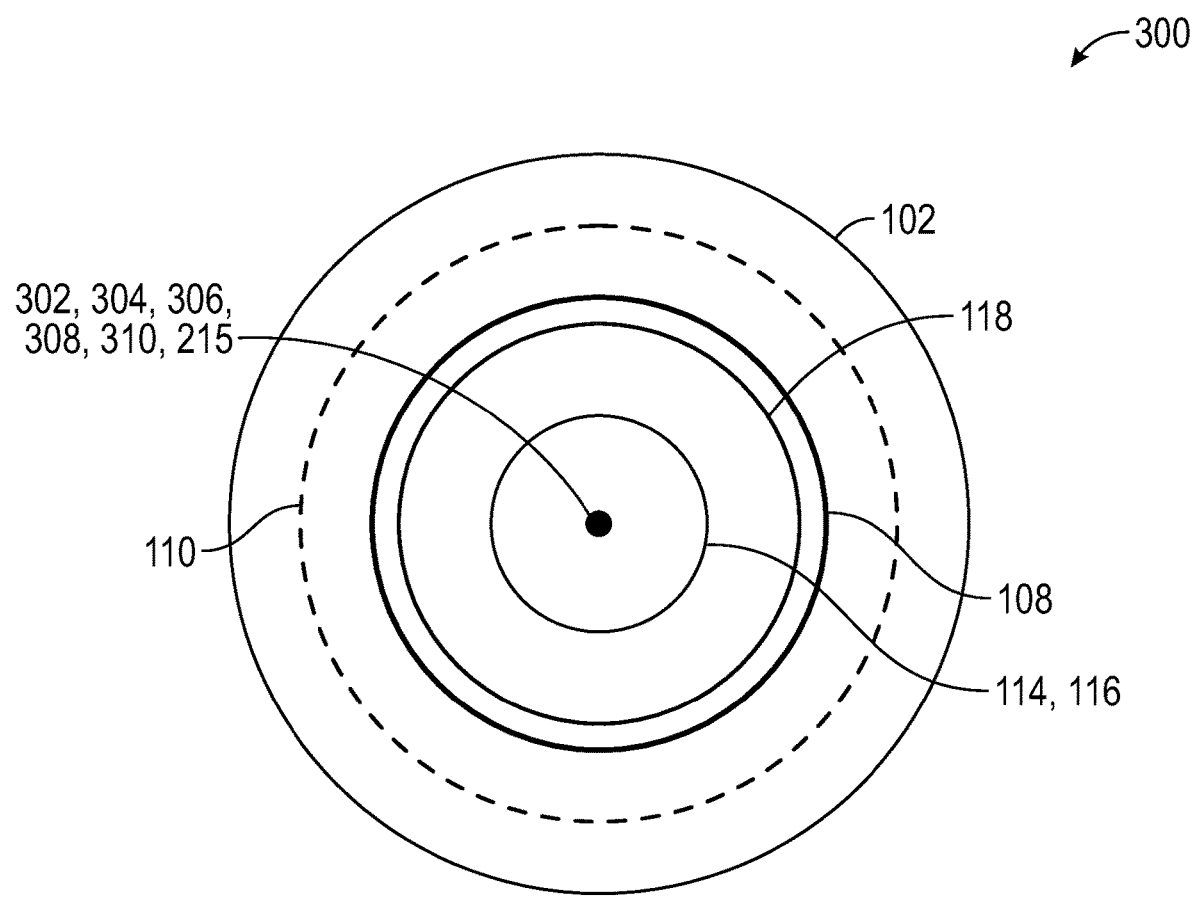
FIG. 3 shows a top view of the furnace of FIG. 1 in the symmetric configuration.

FIG. 3 shows a top view 300 of the furnace of FIG. 1 in the symmetric configuration. The crucible 114/ceramic cylinder 116, refractory lining 118, quartz tube 108, induction coil 110, and cylindrical furnace wall 102 are concentric with each other. In other words, a crucible central axis 302 of the crucible 114, a lining central axis 304 of the refractory lining 118, a quartz central axis 306 of the quartz tube 108, a coil central axis 308 of the induction coil 110, and a furnace central axis 310 of the cylindrical furnace wall 102 share the same axis. The result of this concentric arrangement causes the cold spot to appear along the shared central axis, resulting in impurities forming in the boule.

Figure 4:
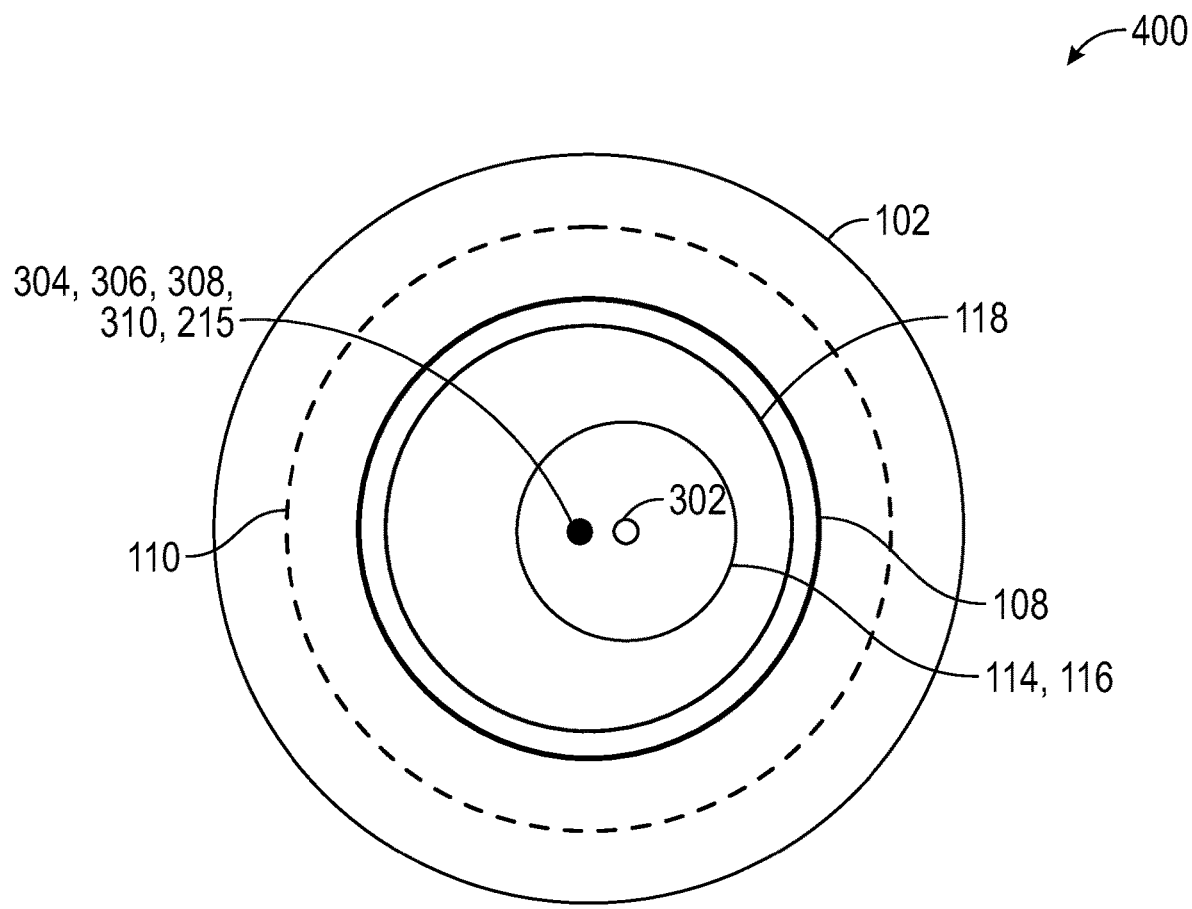
FIG. 4 shows a top view of the furnace showing a first asymmetrical configuration of the furnace.

FIG. 4 shows a top view 400 of the furnace showing a first asymmetrical configuration of the furnace. The lining central axis 304, the quartz central axis 306, and the coil central axis 308 are all concentric with the furnace central axis 310, while the crucible central axis 302 is eccentric from the furnace central axis 310. The eccentricity of the crucible 114 causes the cold spot 215 to migrate away from the crucible central axis 302 (and toward the spot shared by the lining central axis 304, quartz central axis 306, coil central axis 308 and furnace central axis 310).

The rod 124 and seed crystal 122 can be lowered to the melt and drawn up along the crucible central axis 302, thereby allowing the boule to be formed away from the collection of impurities at the cold spot 215.

Figure 5:
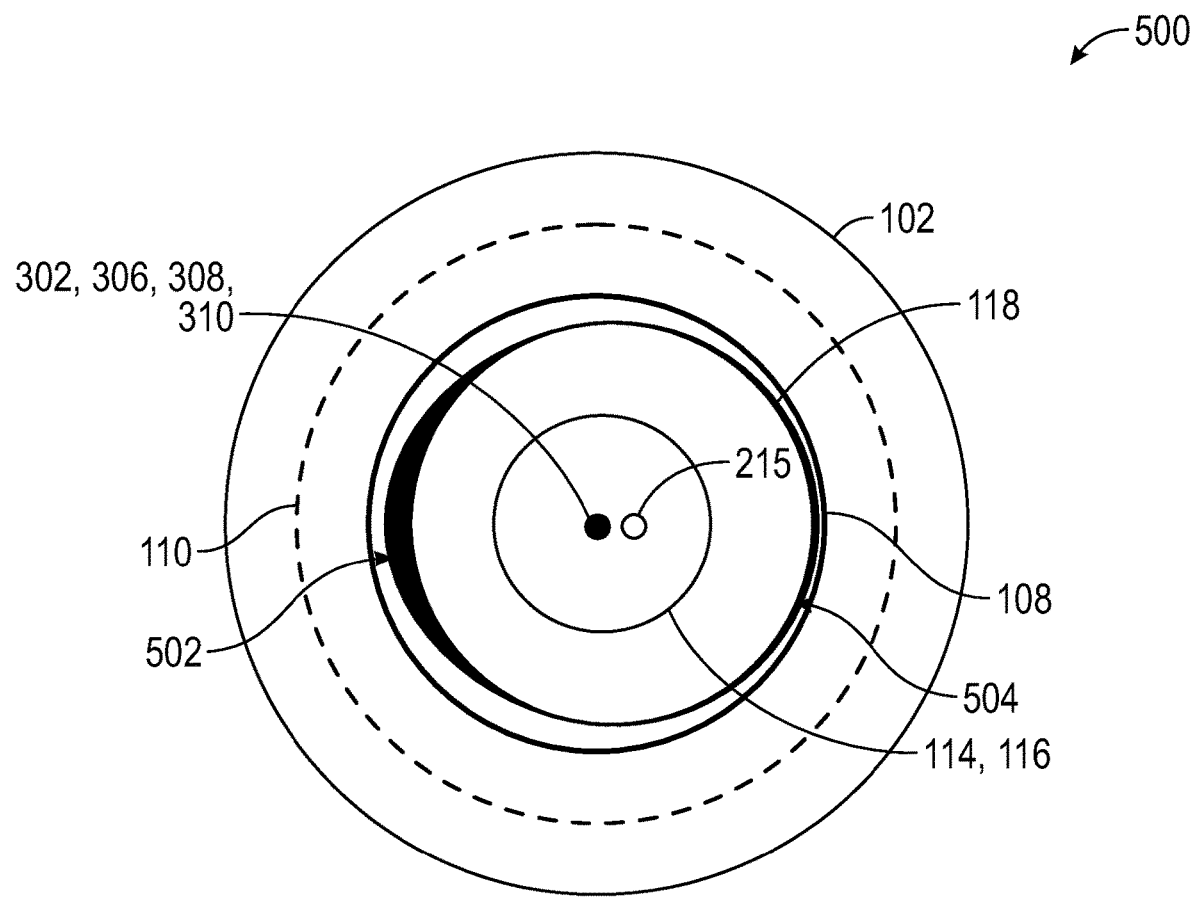
FIG. 5 shows a top view of the furnace showing a second asymmetrical configuration of the furnace.

FIG. 5 shows a top view 500 of the furnace showing a second asymmetrical configuration of the furnace. The crucible central axis 302, the quartz central axis 306, the coil central axis 308 and the furnace central axis 310 are concentric with each other. The refractory lining 118 has a first side 502 that is thicker that a second side 504 opposite the first side 502. As a result, a thermal gradient is created across the melt that causes the cold spot 215 to form at a location off center of the furnace axis 310.

Figure 6:
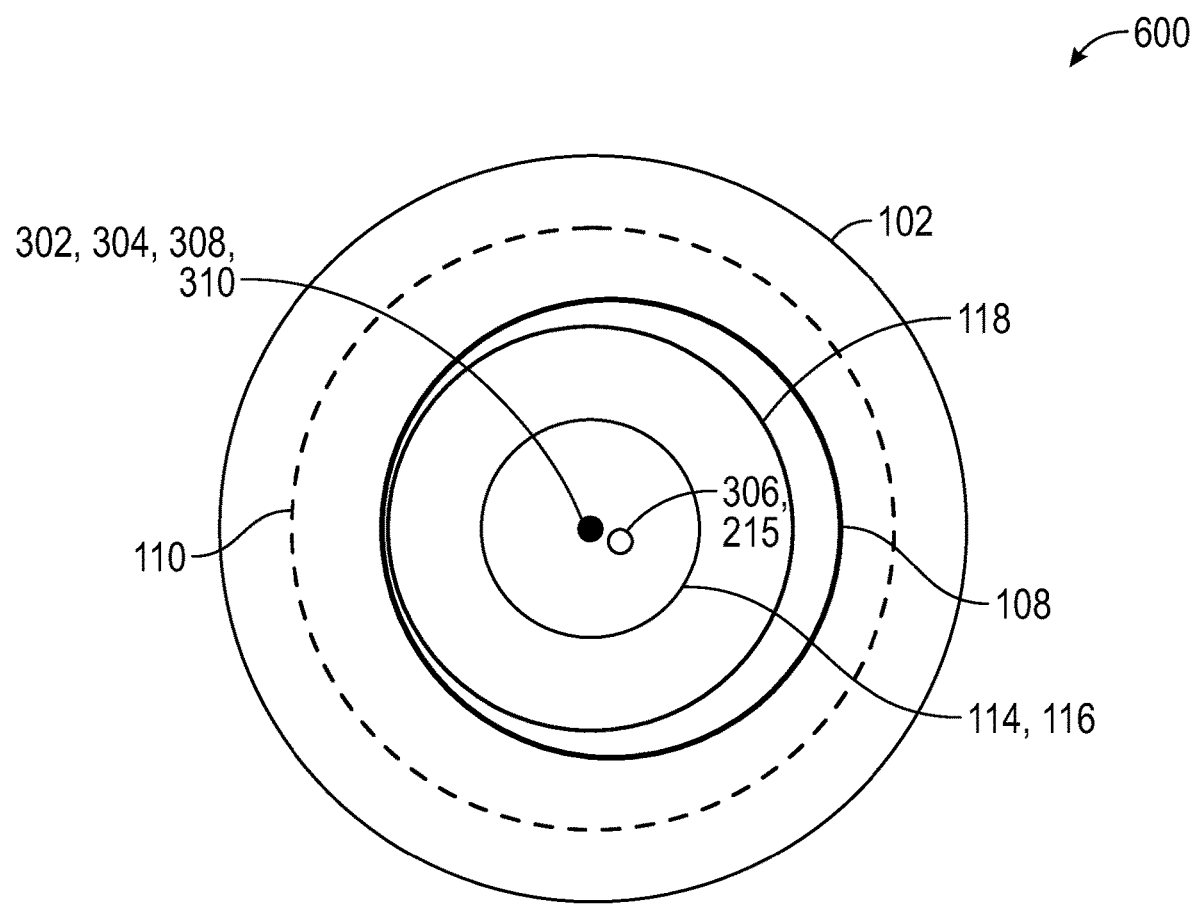
FIG. 6 shows a top view of the furnace showing a third asymmetrical configuration of the furnace.

FIG. 6 shows a top view 600 of the furnace showing a third asymmetrical configuration of the furnace. The crucible central axis 302, the lining central axis 304, and the coil central axis 308 are concentric with the furnace central axis 310. The quartz central axis 306 is eccentric from the furnace central axis 310. The result of the eccentric placement of the quartz central axis 306 is to cause the cold spot 215 to form at a location off the furnace central axis 310. The rod 124 and seed crystal 122 can be placed at the furnace central axis 310.

Figure 7:
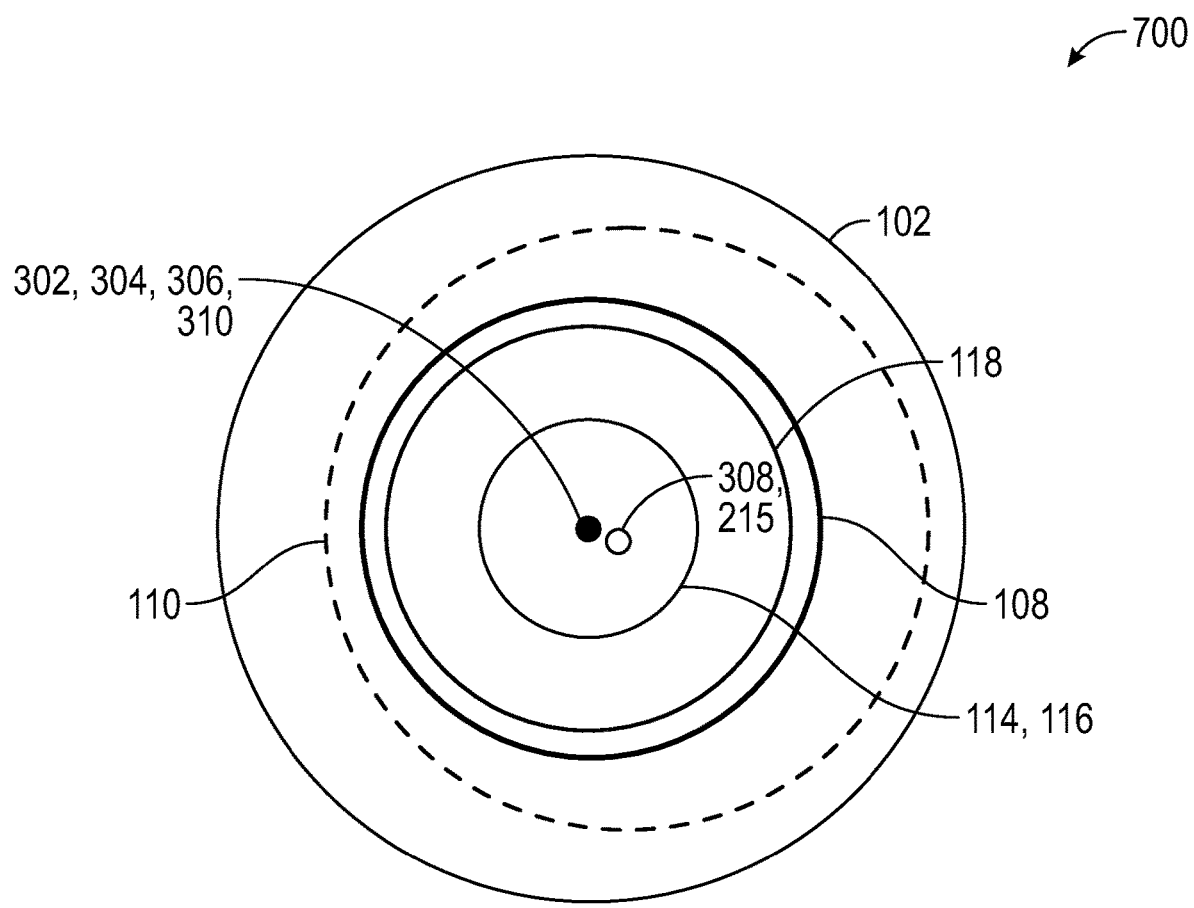
FIG. 7 shows a top view of the furnace in a fourth asymmetrical configuration.

FIG. 7 shows a top view 700 of the furnace in a fourth asymmetrical configuration. The induction coils are arranged eccentrically with respect to the rest of the furnace. The crucible central axis 302, the lining central axis 304, and the quartz central axis 306, are concentric with the furnace central axis 310. The coil central axis 308 is eccentric from the furnace central axis 310. The result of this eccentricity is to create a thermal gradient that allows the cold spot 215 to form away from the furnace central axis 310.

Figure 8:
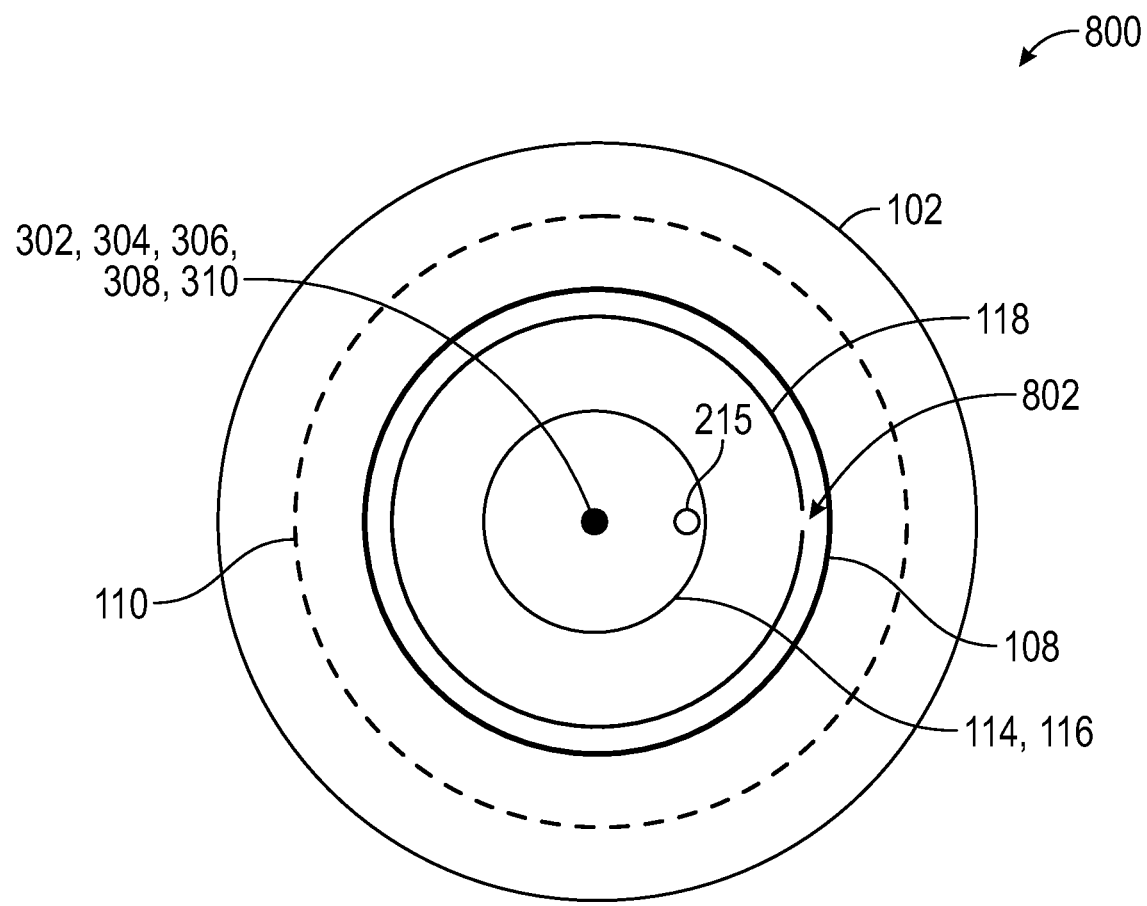
FIG. 8 shows a top view of the furnace in a fifth asymmetrical configuration.

FIG. 8 shows a top view 800 of the furnace in a fifth asymmetrical configuration. The refractory lining 118 includes a hole 802 is formed therein on one side of the crucible 114. The hole 802 causes a thermal gradient within the melt 120 that causes the cold spot 215 to migrate to one side of the crucible 114, in particular, toward the location of the hole 802. Additional holes can be formed in the refractory lining 118. The shape, size and/or location of the additional holes are selected or designed to place the cold spot 215 at a selected location.

Figure 9:
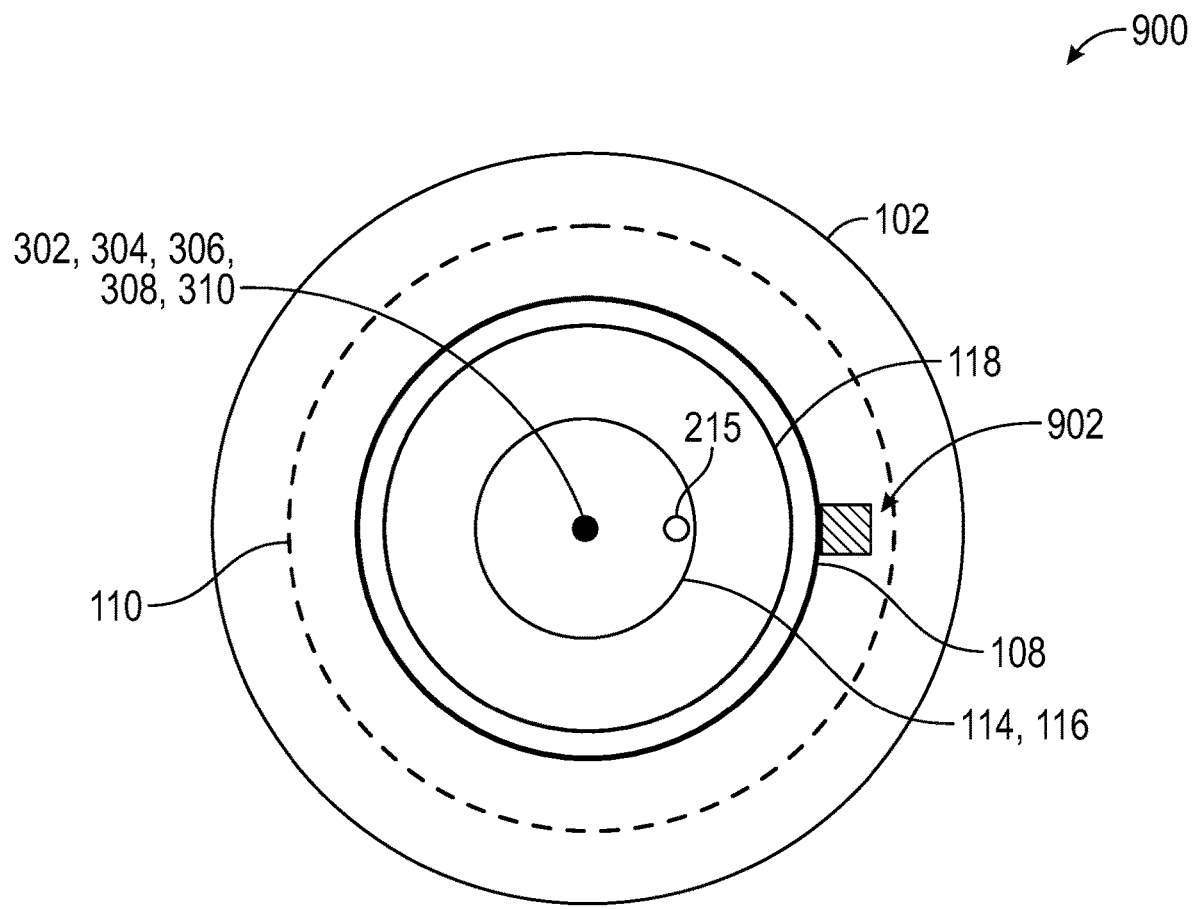
FIG. 9 shows a top view of the furnace in sixth asymmetrical configuration.

FIG. 9 shows a top view 900 of the furnace in sixth asymmetrical configuration. A cold finger is located at the bottom of the quartz tube 108 eccentrically to one side of the crucible 114. The cold finger 902 causes the cold spot 215 to move toward the cold finger and away from the central axis of the crucible 114. The cold finger 902 may be fed with a coolant to retain it at a different temperature from its surroundings in the furnace.

Figure 10:
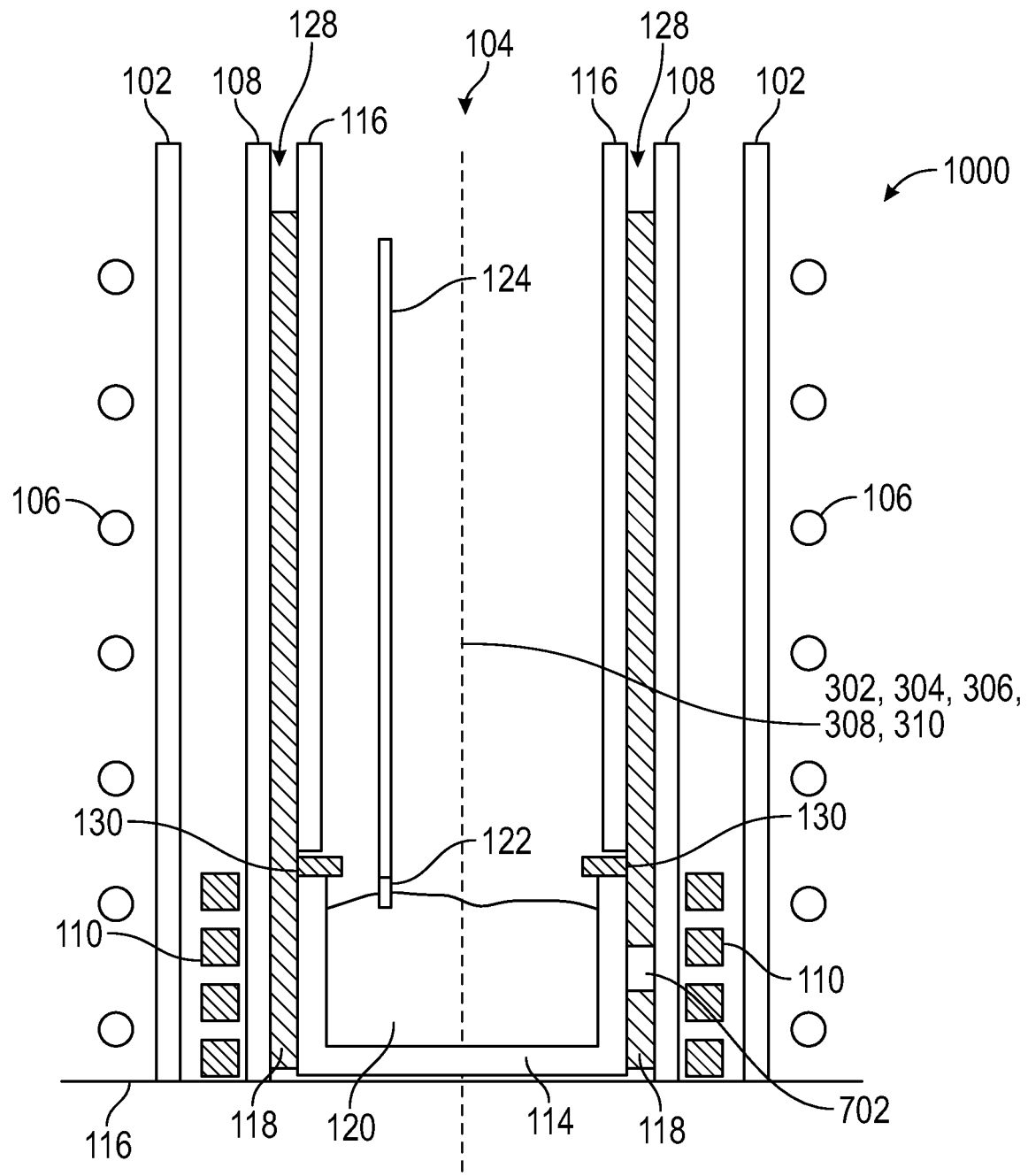
FIG. 10 shows a side view of the furnace in a seventh asymmetrical configuration.

FIG. 10 shows a side view 1000 of the furnace in a seventh asymmetrical configuration. The pull rod is eccentrically located with respect to the center of the crucible and thus is away from the cold spot. Thus, the boule is drawn from a location away from the cold spot 215.

Figure 11:
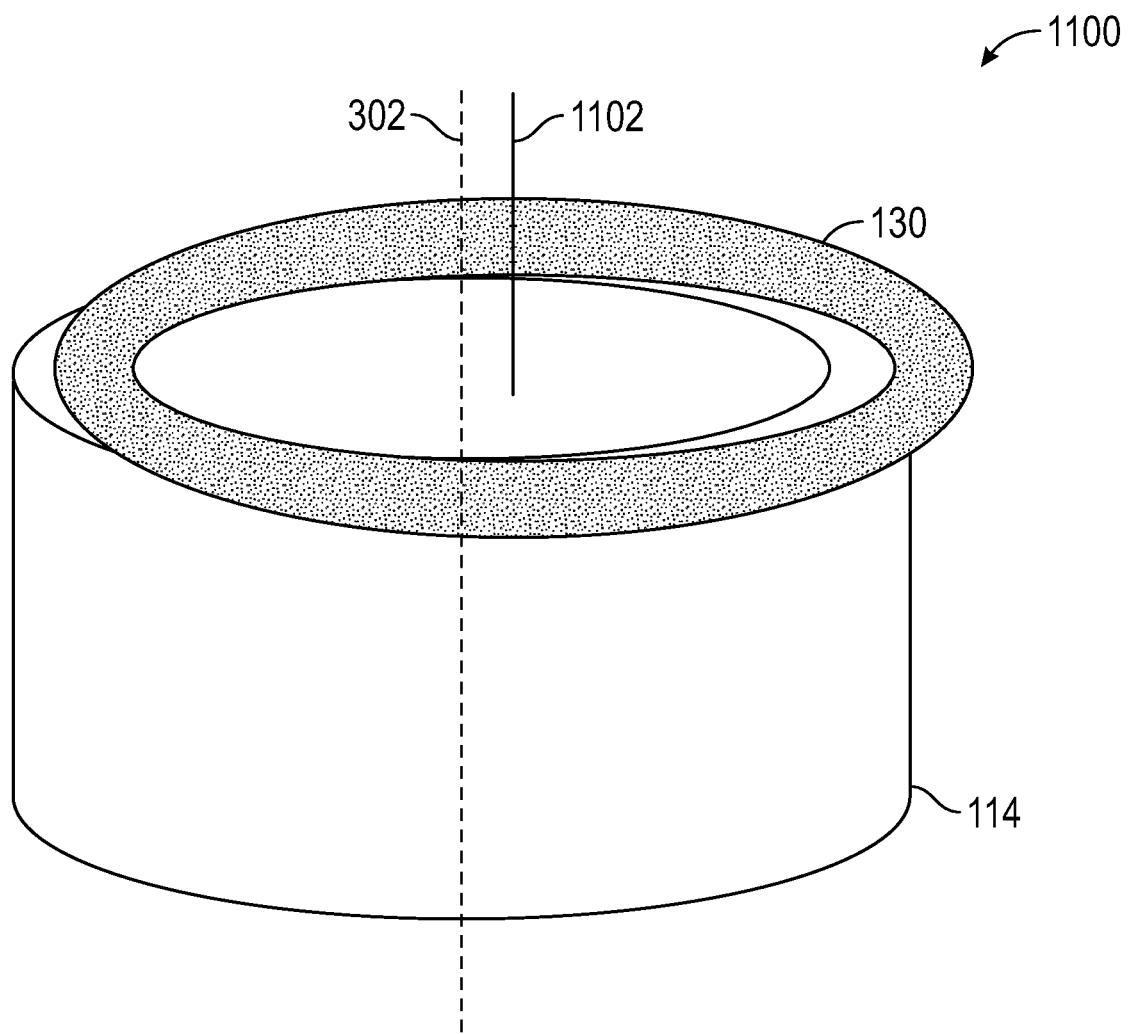
FIG. 11 shows a view of the crucible in an asymmetric configuration.

FIG. 11 shows a view 1100 of the crucible 114 in an asymmetric configuration. While the crucible 114 can be placed symmetrically in the furnace (i.e., crucible central axis 302 coincident with the furnace central axis 310), the lid 130 can be placed asymmetrically with respect to the crucible 114 (i.e., the central axis 1102 of the lid is eccentric from the crucible central axis 302).

Although the present invention has been described in considerable detail with reference to certain preferred versions thereof, other versions are possible. Therefore, the spirit and scope of the appended claims should not be limited to the description of the preferred versions contained herein.

The reader's attention is directed to all papers and documents which are filed concurrently with this specification, and which are open to public inspection with this specification, and the contents of all such papers and documents are incorporated herein by reference.

All the features disclosed in this specification (including any accompanying claims, abstract, and drawings) may be replaced by alternative features serving the same, equivalent, or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C § 112, sixth paragraph. In particular, the use of "step of" in the claims herein is not intended to invoke the provisions of 35 U.S.C § 112, sixth paragraph.

What is claimed is:

1. A method of growing a crystal, comprising:
    placing an induction coil within a cylindrical furnace having a furnace central axis, wherein the induction coil has a coil central axis;
    placing a quartz tube within the induction coil, the quartz tube having a quartz central axis;
    placing a refractory lining within the quartz tube, the refractory lining having a lining central axis, wherein at least one of the coil central axis, the quartz central axis and the lining central axis is placed at an eccentric location with respect to the furnace central axis of the cylindrical furnace;
    placing a crucible within the refractory lining, the crucible including a melt therein;
    placing a lid to cover the crucible;
    heating the crucible and the melt via the induction coil, wherein the eccentric location of the at least one of the coil central axis, the quartz central axis and the lining central axis with respect to the furnace central axis creates a thermal gradient that causes a location in the melt at which the melt descends to the bottom of the crucible via convection to be away from the furnace central axis; and
    drawing the crystal from the melt at the furnace central axis to grow the crystal.

2. The method of claim 1, further comprising a crucible central axis of the crucible to be eccentric from the furnace central axis.

3. The method of claim 1, wherein the refractory lining has a first side that is thicker than a second side opposite the first side.

4. The method of claim 1, further comprising heating the melt with the quartz central eccentric to the furnace central axis and the coil central axis and the lining central axis concentric with the furnace central axis.

5. The method of claim 1, further comprising heating the melt with the coil central axis eccentric to the furnace central axis and the quartz central axis and the lining central axis concentric with the furnace central axis.

6. The method of claim 1, further comprising placing the lid asymmetrically with respect to the crucible.

7. The method of claim 1, wherein the refractory lining includes a hole to one side of the crucible.

8. The method of claim 1, placing a cold finger against the quartz tube to one side of the crucible.

* * * * *